(12) United States Patent
Kimura et al.

(10) Patent No.: US 7,341,936 B2
(45) Date of Patent: Mar. 11, 2008

(54) SEMICONDUCTOR DEVICE AND METHOD OF MANUFACTURING THE SAME

(75) Inventors: Takahiro Kimura, Kawasaki (JP); Chihiro Uchibori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/011,113

(22) Filed: Dec. 15, 2004

(65) Prior Publication Data

US 2005/0101118 A1 May 12, 2005

Related U.S. Application Data

(63) Continuation of application No. PCT/JP03/09424, filed on Jul. 24, 2003.

(30) Foreign Application Priority Data

Aug. 19, 2002 (JP) .............................. 2002-238456

(51) Int. Cl.
   *H01L 21/283* (2006.01)
(52) U.S. Cl. .......................... 438/623; 438/82; 438/99; 438/725; 438/780
(58) Field of Classification Search .................. 438/82, 438/99, 623, 725, 780, 931, FOR. 135, FOR. 260, 438/FOR. 405

See application file for complete search history.

(56) References Cited

U.S. PATENT DOCUMENTS

| 5,973,400 | A | 10/1999 | Murakami et al. |
| 6,187,672 | B1 * | 2/2001 | Zhao et al. ................. 438/639 |
| 6,592,771 | B1 * | 7/2003 | Yamanaka et al. ............ 216/63 |

FOREIGN PATENT DOCUMENTS

| JP | 10-98011 | 4/1998 |
| WO | WO 01/15220 A1 | 3/2001 |

OTHER PUBLICATIONS

Office Action dated May 11, 2006, issued in corresponding Korean Application No. 10 2005 7000561.

* cited by examiner

*Primary Examiner*—George R. Fourson
*Assistant Examiner*—Joannie Adelle Garcia
(74) *Attorney, Agent, or Firm*—Westerman, Hattori, Daniels & Adrian, LLP.

(57) ABSTRACT

A semiconductor device manufacturing method comprises the steps of forming a metal film (24) on an organic interlayer insulating film (22) formed over a semiconductor substrate to get a metal diffusion preventing metal carbide film (23) on a boundary between the organic interlayer insulating film (22) and the metal film (24), and leaving the metal carbide film (23) on the organic interlayer insulating film (22) by removing selectively the metal film (24) from the metal carbide film (23).

10 Claims, 8 Drawing Sheets

US 7,341,936 B2

SEMICONDUCTOR DEVICE AND METHOD OF MANUFACTURING THE SAME

This application continuation of international application PCT/JP03/09424 filed on Jul. 24, 2003.

TECHNICAL FIELD

The present invention relates to a semiconductor device and a method of manufacturing the same and, more particularly, a semiconductor device manufacturing method including a formation of a barrier film for use in a multi-layered wiring formed by a damascene method, and a semiconductor device.

BACKGROUND ART

The LSI is manufactured by connecting basic constituent elements such as transistor, diode, capacitor, resistor, which are arranged electrically separately on a semiconductor substrate, via wirings.

The technology to connect the elements at a high density is the multi-layered wiring technology. This multi-layered wiring technology is the important technology that gets to determine the higher performance of the LSI. The parasitic effect of the resistance, the capacitor, etc. in the multi-layered wiring exerts a great influence on the circuit performance of the LSI.

From such viewpoint, the multi-layered wiring in which the copper (Cu) wiring having a low resistance and the interlayer insulating film formed of the material having a low dielectric constant are used in combination is now used. As this manufacturing method, the burying method, i.e., the so-called damascene method is employed.

The Cu wiring layer has such a characteristic that Cu contained in the Cu wiring layer is liable to diffuse into the interlayer insulating film, or the like during the annealing step, or the like. The Cu diffusion into the interlayer insulating film brings about disadvantages such that a leakage current in the interlayer insulating film is increased, etc. For this reason, the Cu wiring layer is formed in a wiring recess or a via in the interlayer insulating film via a barrier film.

FIG. 1 is a sectional view showing a part of steps of forming the multi-layered wiring by using the dual damascene method in the prior art. In the multi-layered wiring in the prior art, as shown in FIG. 1, first a first wiring layer 104 buried in a wiring recess 102a of a first interlayer insulating film 102, which is formed over a semiconductor substrate 100 onto which predetermined transistors, etc. are provided, is formed. The first wiring layer 104 is composed of a barrier film 104a and a first Cu film 104b, and is connected electrically to the transistors, etc. provided to the lower side.

Then, a second interlayer insulating film 106 consists of a silicon nitride film 106a and a silicon oxide film 106b is formed on the first wiring layer 104. Then, a wiring recess 106x is formed in the second interlayer insulating film 106 and then a via 106y that is communicated with this wiring recess is formed to expose the first wiring layer 104.

Then, a barrier film 108a is formed on an inner surface of the wiring recess 106x, an inner surface of the via 106y and the second interlayer insulating film 106. Then, a second Cu film 108b is formed via the seed Cu layer by the electroplating to fill the wiring recess 106x and the via 106y.

Then, the second Cu film 108b and the barrier film 108a are polished by the CMP (Chemical Mechanical Polishing). Thus, a second wiring layer 108 consists of the barrier film 108a and the second Cu film 108b is formed in the wiring recess 106x and the via 106y.

As the barrier film 108a formed in the wiring recess 106x and the via 106y, the transition metal or its nitride film such as tungsten (W) film, titanium (Ti) film, tantalum (Ta) film, or the like is used. Also, the barrier film 108a is formed by the sputter method to have a film thickness of about 10 to 30 nm. Because normally the sputter method has a poor step coverage, the barrier film 108a is formed thin on a side portion (S portion in FIG. 1) of the via 106y, which has a high aspect ratio, rather than a bottom portion (B portion in FIG. 1) of the wiring recess 106x.

As described above, in case the barrier film 108a is formed by the sputter method in the dual damascene method, such barrier film 108a is formed thin on the side portion S of the via 106y rather than the bottom portion B of the wiring recess 106x. In the barrier film 108a, the sufficient metal barrier property must be ensured over the entire inner surfaces of the wiring recess 106x and the via 106y. Therefore, the barrier film 108a must be formed to have the lowest minimum film thickness that can ensure the barrier property, on the side portion S of the via 106y at which the barrier film 108a has the thinnest film thickness. For this reason, the barrier film 108a having the unnecessarily thick film thickness is formed on the bottom portion B of the wiring recess 106x, etc. except the side portion S of the via 106y.

Normally a resistance of the barrier film 108a made of the above material is considerably higher than a resistance of the second Cu film 108b serving as the major wiring layer. Then, since an overall thickness of the second wiring layer 108 is decided mainly by a depth of the wiring recess 106x, a film thickness of the second Cu film 108b becomes thin when a film thickness of the barrier film 108a becomes thick. Thus, an occupied rate of the barrier film 108a to the overall thickness of the second wiring layer 108 is increased. As a result, this leads an increase in a wiring resistance of the overall second wiring layer 108 (the barrier film 108a+the second Cu film 108b).

As a result, a delay of an electric signal that is propagated over the wiring in the multi-layered wiring of the LSI (wiring delay) is increased. In other words, this signifies that an increase in a CR time constant is caused in the electric circuit, and there is a problem that such delay is an obstacle to a high-speed (high-frequency) operation of the LSI.

DISCLOSURE OF THE INVENTION

It is an object of the present invention to provide a semiconductor device manufacturing method including a barrier film forming method capable of suppressing an increase in resistance of a metal wiring layer due to the presence of a barrier film when a metal wiring layer is formed by the dual damascene method, and a semiconductor device.

The present invention is concerned with a semiconductor device manufacturing method which comprises the steps of forming a metal film on an organic interlayer insulating film formed over a semiconductor substrate to get a metal diffusion preventing metal carbide film on a boundary between the organic interlayer insulating film and the metal film; and leaving the metal carbide film on the organic interlayer insulating film by removing selectively the metal film from the metal carbide film.

As described above, in the barrier film used as the multi-layered wiring formed by the damascene method, it is preferable from a viewpoint of preventing the diffusion of the metal that the film thickness of the barrier film should be formed thick to some extent whereas it is preferable from a viewpoint of suppressing an increase in the resistance of the overall wiring that the film thickness of the barrier film should be formed as thin as possible.

One of features of the present invention is that an increase in the wiring resistance can be suppressed by forming the barrier film, which has a required minimum film thickness, to have an almost identical film thickness on both the side portion of the via and the bottom portion of the wiring recess.

In the present invention, the metal carbide film is obtained on the boundary between the organic interlayer insulating film and the metal film by forming the metal film on the organic interlayer insulating film. This metal carbide film has a metal diffusion preventing function and is formed when the metal in the metal film reacts with the carbon (C) in the organic interlayer insulating film near the boundary between them. Then, the metal carbide film is left on the organic interlayer insulating film by removing selectively the metal film from the metal carbide film. A film thickness of the metal carbide film seldom depends on the film thickness of the metal film when the metal film exceeds a predetermined film thickness.

In one preferred mode of the present invention, a wiring recess and a via formed to communicate with a predetermined portion of a bottom portion of the wiring recess are provided on the organic interlayer insulating film (e.g., organic SOG film). For example, when the barrier film is formed on the organic interlayer insulating film having such structure by the sputter, the wiring resistance is increased because the barrier film is formed unnecessarily thick on the bottom portion of the wiring recess, as described above.

In the present invention, because the metal film (e.g., the tantalum film) of a predetermined film thickness or more is formed on the organic interlayer insulating film, the metal carbide film (e.g., tantalum carbide film) having the film thickness, which hardly depends on the film thickness of the metal film, is formed on the boundary. Therefore, even though the metal film having the thickness thicker than that on the side portion of the via is formed on the bottom portion of the wiring recess, the metal carbide film is formed to have the substantially equal film thickness on the side portion of the via and the bottom portion of the wiring recess.

In addition, since the unreacted metal film on the surface layer can be removed selectively from the metal carbide film, the metal carbide film can be left to have the substantially equal film thickness on the side portion of the via and the bottom portion of the wiring recess. This metal carbide film is formed like a thin film of about 2 nm thickness, for example, and has a sufficient metal diffusion preventing function.

Therefore, since the barrier metal film is never formed unnecessarily (excessively) thick on the bottom portion of the wiring recess, a rate occupied by the barrier film, whose resistance is high, in the wiring layer consisting of the barrier film and the metal wiring film can be reduced. As a result, the resistance of the wiring layer can be made low rather than the prior art while keeping the sufficient metal diffusion preventing function.

BEST MODE FOR CARRYING OUT THE INVENTION

An embodiment of the present invention will be explained with reference to the accompanying drawings hereinafter.

Figure 1:
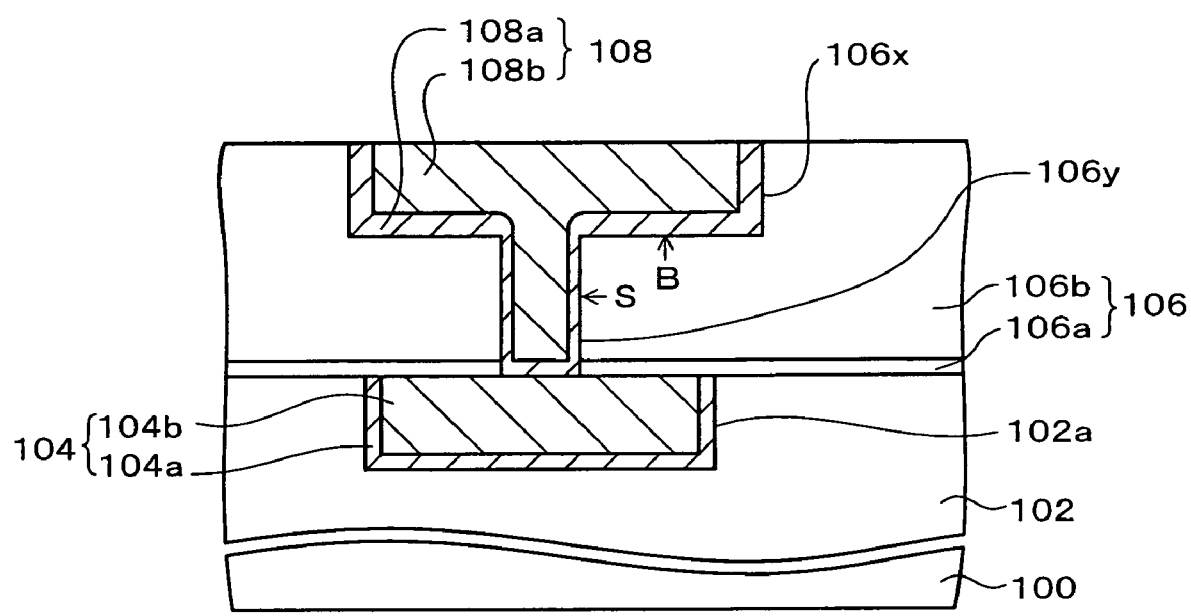
FIG. 1 is a sectional view showing a part of steps of forming a multi-layered wiring by the dual damascene method in the prior art.
Figure 2:
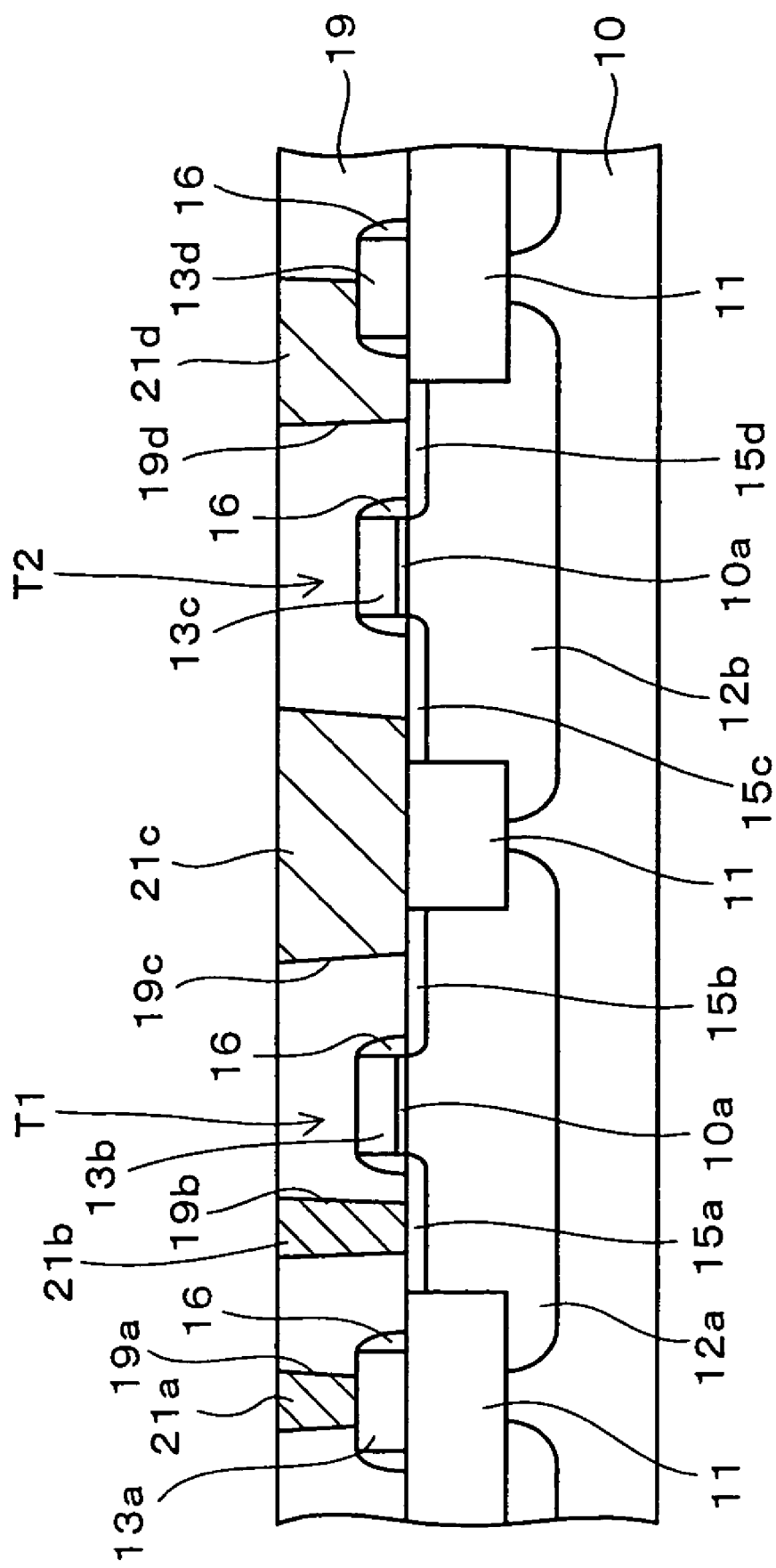
FIG. 2 is a sectional view (#1) showing a method of manufacturing a semiconductor device according to an embodiment of the present invention.
Figure 3:
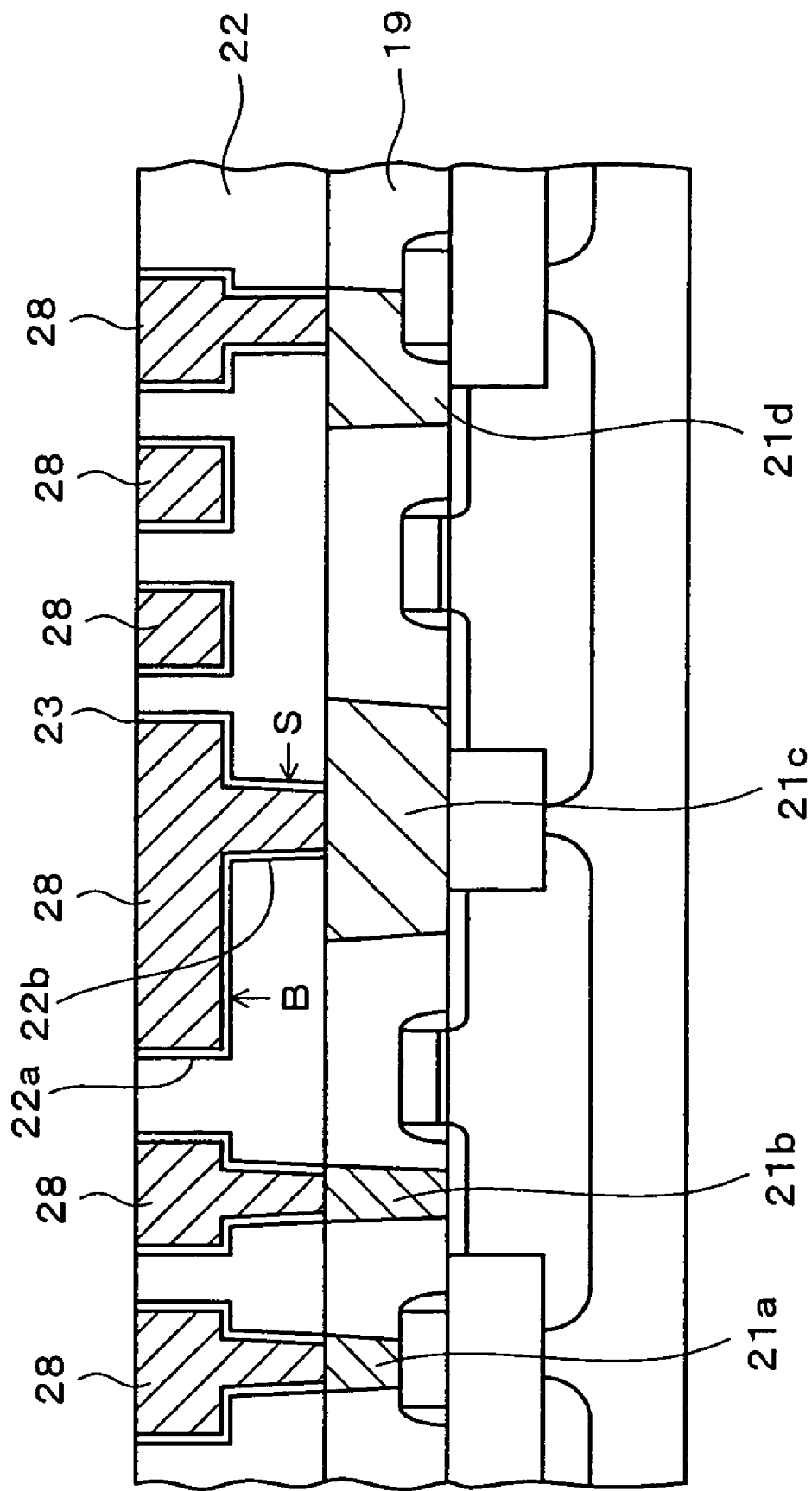
FIG. 3 is a sectional view (#2) showing the method of manufacturing the semiconductor device according to the embodiment of the present invention.
Figure 4:
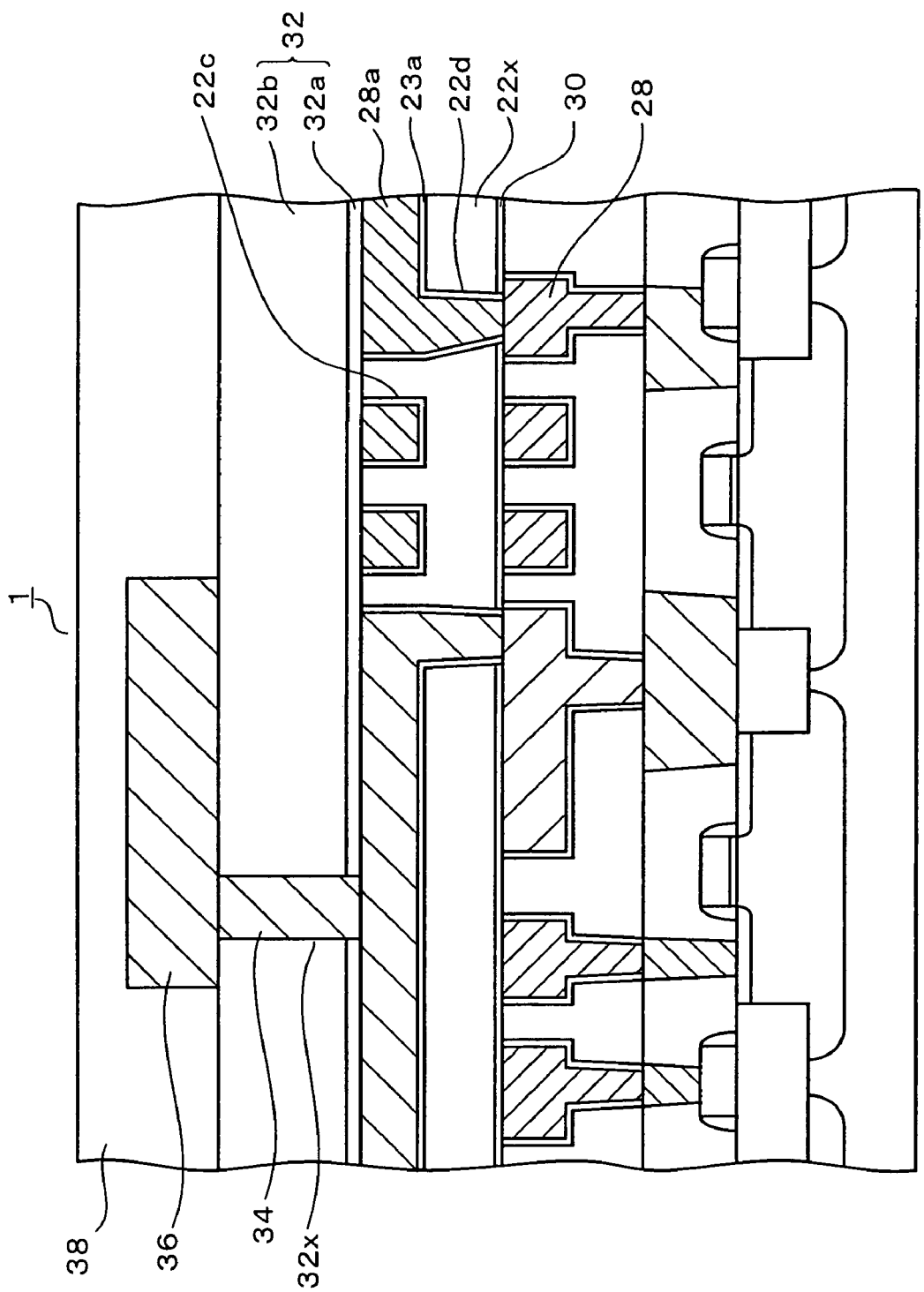
FIG. 4 is a sectional view (#3) showing the method of manufacturing the semiconductor device according to the embodiment of the present invention.

FIG. 2 to FIG. 4 are sectional views showing a method of manufacturing a semiconductor device according to an embodiment of the present invention. In the present embodiment, while explaining the step of forming a multi-layered wiring over a semiconductor substrate having predetermined transistors by the dual damascene method, a method of forming a barrier film will be explained hereinafter.

First, the steps required until a sectional structure shown in FIG. 2 is obtained will be explained hereunder. As shown in FIG. 2, first an element isolation insulating film 11 is formed selectively on a surface of a p-type silicon (semiconductor) substrate 10 by the STI (Shallow Trench Isolation) method. The LOCOS (Local Oxidation of Silicon) method may be employed to form the element isolation insulating film 11. Then, a p-type impurity and an n-type impurity are introduced selectively into an active region (transistor forming region) of the silicon substrate 10 respectively. Thus, a p-well 12a and an n-well 12b are formed.

Then, a silicon oxide film is formed as a gate insulating film 10a by the thermally oxidizing a surface of the active region of the silicon substrate 10.

Then, an amorphous silicon film and a tungsten silicide film, for example, are formed in seriatim on the overall upper surface of the silicon substrate 10. Then, gate electrodes 13b, 13c and gate wirings 13a, 13d are formed by patterning these films into a predetermined shape by the photolithography method. Thus, the gate electrode 13b is arranged on the p-well 12a and the gate electrode 13c is arranged on the n-well 12b.

Then, first and second n-type impurity diffusion regions 15a, 15b serving as source/drain of an n-channel MOS transistor are formed by ion-implanting the n-type impurity into the p-well 12a on both sides of the gate electrode 13b.

Then, first and second p-type impurity diffusion regions 15c, 15d serving as source/drain of a p-channel MOS transistor are formed by ion-implanting the p-type impurity into the n-well 12b on both sides of the gate electrode 13c. The individual implantation of the n-type impurity and the p-type impurity is executed by using the resist pattern.

Then, an insulating film is formed on an overall surface of the silicon substrate 10. Then, a sidewall insulating film 16 is left on both-side portions of the gate wirings 13a, 13d and the gate electrodes 13b, 13c respectively by etching back the insulating film. As the insulating film, for example, a silicon oxide film (SiO$_2$ film) is formed by the CVD (Chemical Vapor Deposition) method.

Then, the n-type impurity is ion-implanted once again into the first and second n-type impurity diffusion regions 15a, 15b by using the gate electrode 13b and the sidewall insulating films 16 as a mask. Thus, the first and second n-type impurity diffusion regions 15a, 15b are formed as an LDD structure. Similarly, the p-type impurity is ion-implanted once again into the first and second p-type impurity diffusion regions 15c, 15d by using the gate electrode 13c and the sidewall insulating films 16 as a mask. Thus, the first and second p-type impurity diffusion regions 15c, 15d are formed as the LDD structure.

With the above steps, an n-channel MOS transistor T1 having the gate electrode 13b and the first and second n-type impurity diffusion regions 15a, 15b in the LDD structure is formed in the p-well 12a. Also, a p-channel MOS transistor T2 having the gate electrode 13c and the first and second p-type impurity diffusion regions 15c, 15d in the LDD structure is formed in the n-well 12b.

Then, a silicon nitride film (SiON film) of about 50 nm thickness and a silicon oxide film (SiO$_2$ film) of about 1.0 μm thickness are grown sequentially by the CVD method to cover the MOS transistors T1, T2. Then, the silicon oxide film is polished by a predetermined amount by the CMP (Chemical Mechanical Polishing) method to planarize its upper surface. Thus, a lower interlayer insulating film 19 is obtained.

Then, first to fourth contact holes 19a to 19d are formed by patterning the lower interlayer insulating film 19 by virtue of the photolithography method. At this time, the first contact hole 19a is formed to a depth reaching an upper surface of the gate wiring 13a, and the second, third, and fourth contact holes 19b, 19c, 19d are formed to depths reaching the n-type impurity diffusion regions 15a to 15d respectively. Then, the third contact hole 19c is opened so as to connect the second n-type impurity diffusion region 15b of the n-channel transistor and the first p-type impurity diffusion region 15c of the p-channel transistor, both formed to put the element isolation insulating film 11 therebetween. Also, the fourth contact hole 19d is opened so as to connect the second p-type impurity diffusion region 15d of the n-channel transistor and an upper surface of the gate wiring 13d.

Then, a Ti (titanium) thin film of 30 nm thickness and a TiN (titanium nitride) thin film of 50 nm thickness are formed sequentially on an upper surface of the lower interlayer insulating film 19 and inner surfaces of the first to fourth contact holes 19a to 19d respectively by the sputter method, and thus a glue film is formed. Then, tungsten (W) is grown on the glue film by the CVD method. Thus, the tungsten film is buried in the first to fourth contact holes 19a to 19d.

Then, the tungsten film and the glue film are polished by the CMP method until the upper surface of the lower interlayer insulating film 19 is exposed. Thus, first to fourth metal plugs 21a to 21d made of the glue film and the tungsten film buried in the first to fourth contact holes 19a to 19d respectively are formed.

The first metal plug 21a is formed on the gate wiring 13a, and the second metal plug 21b is formed on the first n-type impurity diffusion region 15a of the n-channel MOS transistor Ti. Also, the third metal plug 21c is formed as a common plug that short-circuits the second n-type impurity diffusion region 15b of the n-channel MOS transistor T1 and the first p-type impurity diffusion region 15c of the p-channel MOS transistor T2. In addition, the fourth metal plug 21d is formed as a common plug that short-circuits the second p-type impurity diffusion region 15d of the p-channel MOS transistor T2 and the gate wiring 13d. With the above, the sectional structure shown in FIG. 2 is obtained.

Next, a method of forming a multi-layered wiring connected to the first to fourth metal plugs 21a to 21d will be explained hereunder. The steps of forming the multi-layered wiring will be explained with reference to FIGS. 5A to 5C and FIGS. 6A to 6D hereunder. FIGS. 5A to 5C and FIGS. 6A to 6D are sectional views showing a barrier film according to the embodiment of the present invention.

First, an organic SOG (Spin On Glass) manufactured by Dow Corning Co. (product name: SILK), Allied Signal Co. (product name: FLARE), or the like is prepared. An organic SOG film having a low relative dielectric constant (e.g., about 2.4 or less) can be formed by coating such organic SOG on a substrate as a coating liquid and then curing the liquid.

Figure 5A:
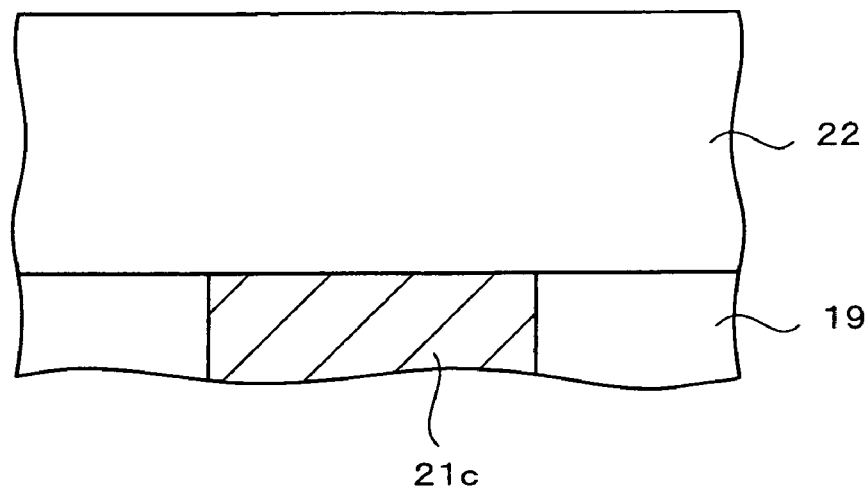
FIGS. 5A to 5C are sectional views (#1) showing a method of forming a barrier film according to the embodiment of the present invention.

As shown in FIG. 5A, the organic SOG coating liquid of about 0.8 to 1.2 μm is coated on the above structure in FIG. 2, i.e., on the lower interlayer insulating film 19 and the first to fourth metal plugs 21a to 21d by the spin coater, and then is cured at about 350 to 400° C. Thus, a first organic SOG interlayer film 22 (organic interlayer insulating film) is formed.

Then, a hard mask (not shown) made of an SiO$_2$ film, or the like is formed on the first organic SOG interlayer film 22, and then resist film patterns (not shown) used to form wiring recess patterns are formed by the photolithography. Then, the hard mask is etched by the dry etching using a CF$_4$/CHF$_3$-based gas, or the like while using the resist film as a mask.

Figure 5B:
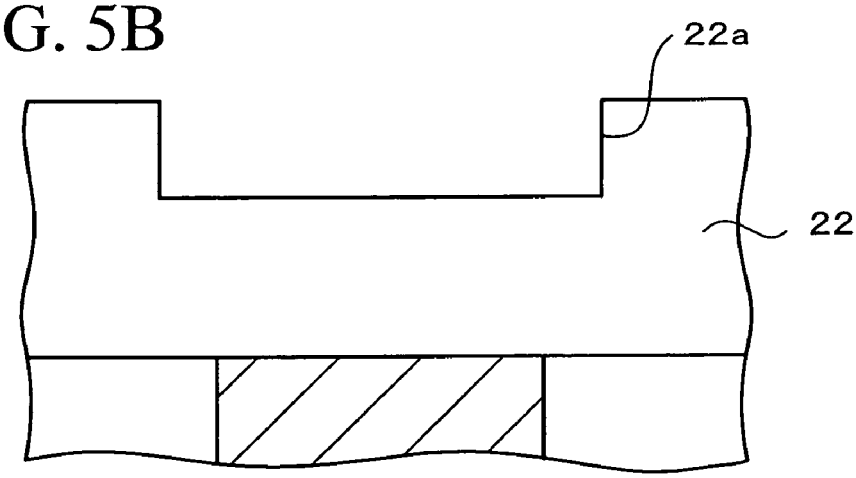

Then, as shown in FIG. 5B, a wiring recess 22a having a depth of about 300 to 400 nm is formed by half-etching the first organic SOG interlayer film 22 while using the resist film and the hard mask layer as a mask. At this time, the first organic SOG interlayer film 22 is etched by the anisotropic dry etching using an NH$_3$ gas, an N$_2$/H$_2$-based gas, a gas containing an oxygen, or the like and simultaneously the resist film as the organic film is removed by the etching.

Figure 5C:
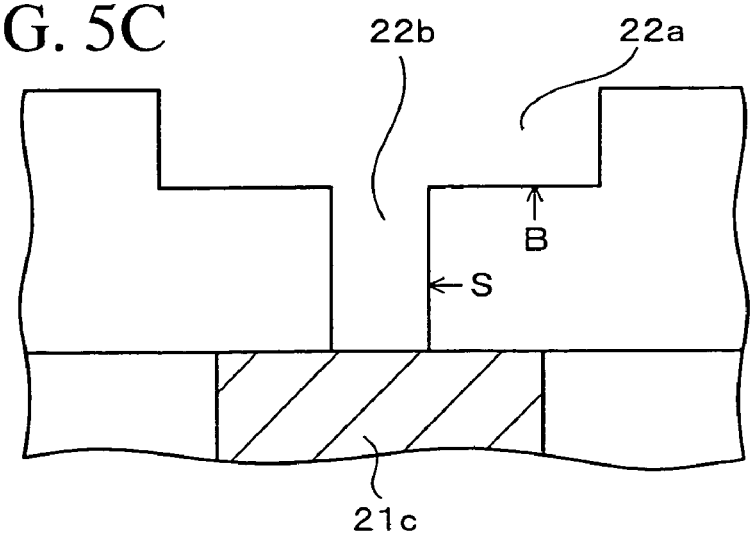

Then, as shown in FIG.5C, the hard mask and the resist film are patterned on the first organic SOG interlayer film 22 in which the wiring recess 22a is formed by the above method. Then, a via 22b is formed to a depth reaching the third metal plug 21c by etching the first organic SOG interlayer film 22 while using the hard mask and the resist film as a mask. In this case, a mode in which the via 22b is formed after the wiring recess 22a is formed is illustrated, but the wiring recess 22a may be formed after the via 22b is formed.

Next, a method of forming a Cu diffusion preventing barrier film on inner surfaces of the via 22b and the wiring recess 22a of the first organic SOG interlayer film 22 will be explained hereunder. At first, the technical concept or idea about the barrier film forming method in the embodiment of the present invention will be explained hereunder. In the case where the barrier film made of tantalum, or the like is formed on inner surfaces of the via 22b and the wiring recess 22a by the sputter method, such barrier film is formed thin on the side portion S of the via 22b, which has a high aspect ratio, rather than the bottom portion B of the wiring recess 22a since normally the sputter method has a poor step coverage.

Therefore, no matter how the barrier film is formed on the side portion S of the via 22b to have the lowest minimum film thickness that is able to prevent the diffusion of Cu (e.g., film thickness of 10 to 30 nm), the barrier film of an excessive film thickness, which is twice or thrice the film thickness formed on the side portion S, is formed on the bottom portion B of the wiring recess 22a. Normally, a resistance of the barrier film such as the tantalum film, or the like is high rather than the main wiring layer such as the Cu film, or the like. Therefore, if a rate occupied by the barrier film in a total thickness of the barrier film and the main wiring layer, which are buried in the wiring recess 22a, is increased, a resistance of the overall wiring is increased.

In this manner, it is preferable from a viewpoint of preventing the diffusion of Cu that the film thickness of the barrier film should be formed thick to some extent whereas it is preferable from a viewpoint of suppressing an increase in the resistance of the overall wiring that the film thickness of the barrier film should be formed as thin as possible.

One of features of the present invention is that, because the barrier film of the required minimum film thickness can be formed to have the substantially identical film thickness on both the side portion S of the via 22b and the bottom portion B of the wiring recess 22a, an increase in the wiring resistance can be suppressed while fulfilling a sufficient Cu diffusion preventing function.

Figure 6A:
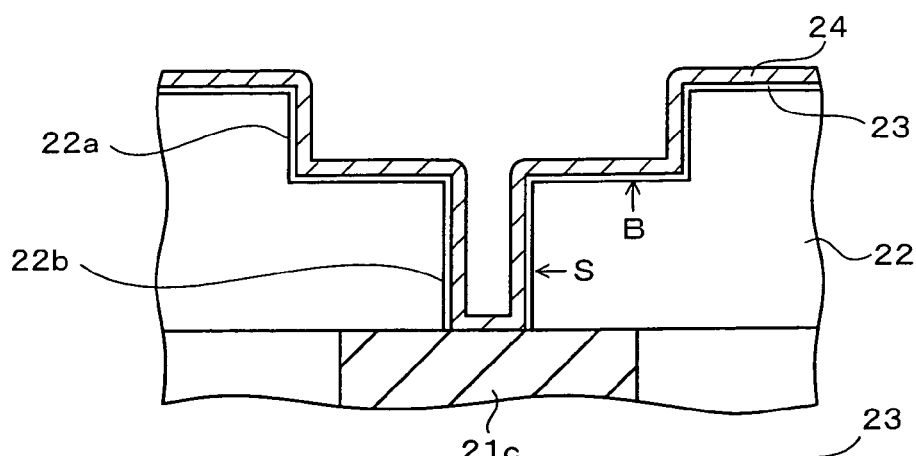
FIGS. 6A to 6D are sectional views (#2) showing a method of forming the barrier film according to the embodiment of the present invention.
Figure 6B:
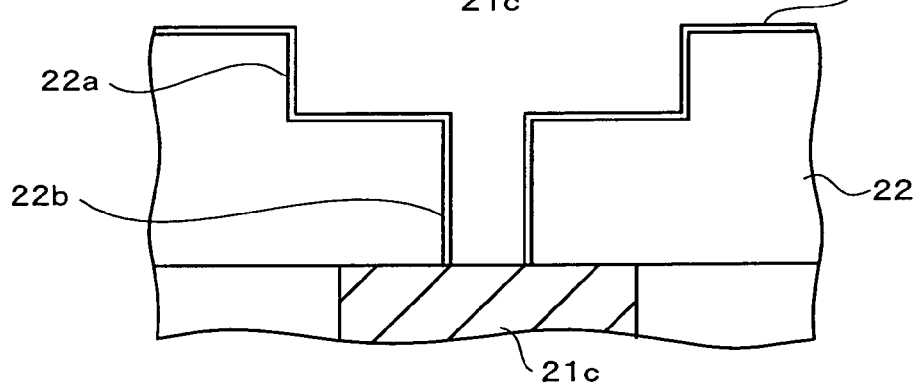

More particularly, as shown in FIG. 6A, first a tantalum (Ta) film 24 having a film thickness of 2 nm or more, preferably about 2 to 10 nm is formed on an inner surface of the via 22b, an inner surface of the wiring recess 22a, and the first organic SOG interlayer film 22 by the sputter method. As described above, the Ta film is formed unnecessarily thick on the bottom portion B of the wiring recess 22a in a situation that such Ta film is formed by the sputter method.

However, the inventors of this application found the fact that, when the Ta film 24 is formed on the first organic SOG interlayer film 22, Ta in the Ta film 24 reacts with carbon (C) in the first organic SOG interlayer film 22 to thus form a tantalum carbide (TaC) film 23 (metal carbide film) having the Cu diffusion preventing function on the boundary between them, as shown similarly in FIG. 6A. In addition, the barrier film is formed to have the almost identical film thickness on both the side portion S of the via 22b and the bottom portion B of the wiring recess 22a. As described in the experimental results explained later, for example, when the Ta film 24 is formed to have a film thickness of about 2 nm or more, the TaC film 23 having a film thickness below 2 nm is formed to have the almost same film thickness on both the side portion S of the via 22b and the bottom portion B of the wiring recess 22a. Also, since the unreacted Ta film 24 left on a surface layer can be removed selectively from the TaC film 23, only the TaC film 23 of a desired almost identical film thickness can be left on both the side portion S of the via 22b and the bottom portion B of the wiring recess 22a.

For example, an etching rate of the chemicals containing a dilute hydrofluoric acid or a hydrofluoric acid (etching rate of the Ta film/etching rate of the TaC film) is considerably high. Therefore, the Ta film 24 that increases the resistance of the overall wiring is formed unnecessarily thick on the bottom portion B of the wiring recess 22a at a point of time when the Ta film 24 is formed by the sputter method. In this case, if the unreacted Ta film 24 left on the surface layer is etched selectively by the dilute hydrofluoric acid, the TaC film 23 of the desired film thickness, which is able to have a sufficient Cu diffusion preventing function, can be left to have the almost identical film thickness on the overall area of the side portion S of the via 22b and the bottom portion B of the wiring recess 22a.

As described above, as shown in FIG. 6B, the TaC film 23 of almost same film thickness is left in the via 22b and the wiring recess 22a by removing the unreacted Ta film 24 by the dilute hydrofluoric acid. At this time, since the Ta film 24 on the third metal plug 21c does not react with C in the first organic SOG interlayer film 22 and still remains as the Ta film state on the overall area, such Ta film is removed by the dilute hydrofluoric acid and thus the TaC film 23 is not left on the third metal plug 21c.

In the present embodiment, upon removing the unreacted Ta film 24 by the dilute hydrofluoric acid, the third metal plug 21c made of the TiN film and the W film, etc. are exposed from the bottom portion of the via 22b. In this case, since the TiN film and the W film are seldom etched by the dilute hydrofluoric acid, these films are never damaged by the hydrofluoric acid and thus no problem arises. Also, in case the Cu film exists on the bottom portion of the via 22b, no problem arises similarly.

Next, results of experiments made by the inventors of this application will be explained hereunder. The inventors of this application confirmed by the XPS analysis that, when the Ta film 24 is formed on the first organic SOG interlayer film 22, the TaC film 23 is formed on the boundary between them.

Figure 7A:
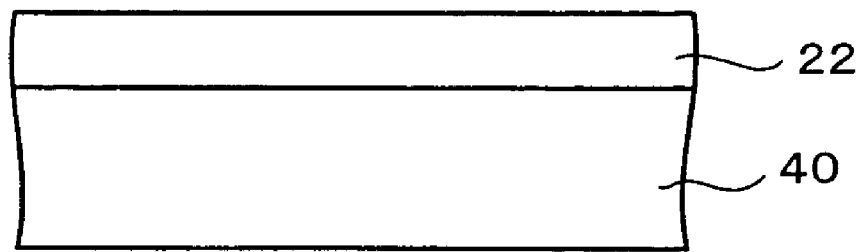
FIGS. 7A and 7B are sectional views showing a method of forming a test sample.

As the test sample, as shown in FIG. 7A, first the organic SOG coating liquid (manufactured by Dow Corning Co.: SiLK J) was coated on a silicon substrate 40, then the primary solvent was evaporated by executing the temporal firing at 320° C. for 90 second, and then the resultant structure was cured in the 400° C. atmosphere for 30 minute. Thus, the organic SOG interlayer film 22 was formed. At this time, a crosslinking rate of the organic SOG interlayer film 22 was 70%. Then, the silicon substrate 40 was loaded into an XPS analysis chamber of the sputter equipment having the XPS analysis chamber, and then a surface of the organic SOG interlayer film 22 was XPS-analyzed. A degree of achieved vacuum of the XPS analysis chamber was $4 \times 10^{-8}$ Torr.

Figure 7B:
Figure 7B:
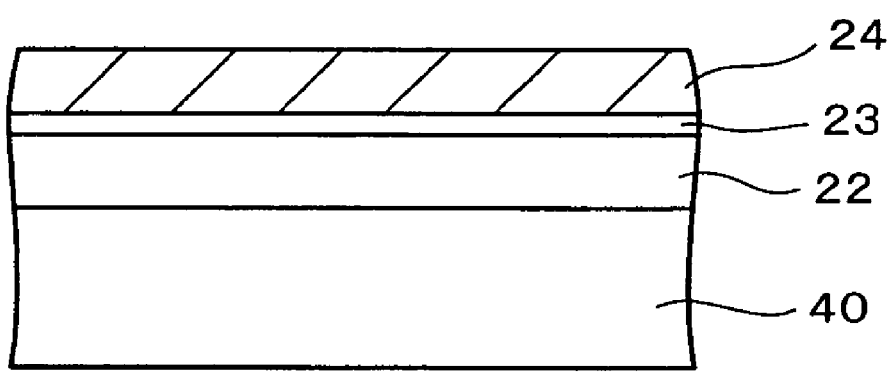

Then, as shown in FIG. 7B, the silicon substrate 40 was loaded into a sputter chamber, and then the silicon substrate 40 was held for 30 minute on a stage whose temperature is set to about 300° C. Then, the Ta film 24 was sputtered onto the organic SOG interlayer film 22. The sputter was applied under the sputter conditions of a substrate temperature: 300° C., a RF power: 400 W (a current: about 0.9 A), a sputter gas: Ar, a substrate bias: not applied, and a degree of achieved vacuum in the chamber: $3 \times 10^{-9}$ Torr.

Then, as similarly shown in FIG. 7B, the silicon substrate 40 was held at 300° C. for 30 minute after the Ta film 24 was formed by the sputter, then the silicon substrate was cooled down, then the silicon substrate 40 was loaded into the XPS analysis chamber, and then the surface of the Ta film 24 was XPS-analyzed. In order to examine the thickness dependency of the Ta film 24, the steps consisting of the sputter of the Ta film 24 and the XPS analysis were repeated three times. In other words, first the XPS analysis was applied to the Ta film 24 that was formed by 0.4 nm in thickness, then the XPS analysis was applied to the Ta film 24 that was further formed by 0.4 nm in thickness (a total film thickness was 0.8 nm), and then the XPS analysis was applied to the Ta film 24 that was further formed by 1.2 nm in thickness (a total film thickness was 2.0 nm). In this case, a film thickness control upon sputtering the thin film was executed by the shutter control, and the film was formed by 0.4 nm in thickness when the shutter was opened for 1 second.

Figure 8:
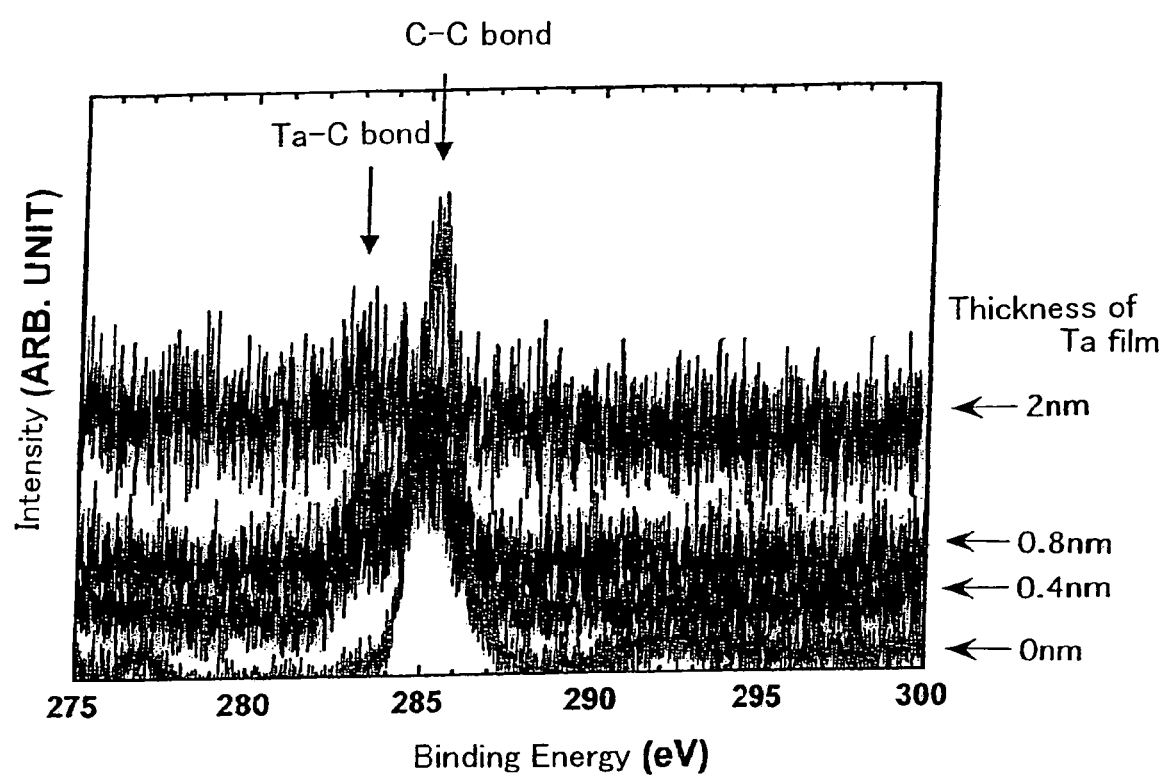
FIG. 8 is a chart showing XPS-analyzed results of a surface of a Ta film after the Ta film is formed on an organic SOG film.

Next, results analyzed by the XPS will be explained hereunder. FIG. 8 is a chart showing results of the surface of the Ta film analyzed by the XPS after the Ta film is formed on the organic SOG film. In FIG. 8, an abscissa denotes a binding energy and an ordinate denotes its intensity.

As shown in FIG. 8, when the Ta film 24 was not formed on the organic SOG interlayer film 22, no peak derived from a Ta—C bond was detected and a peak derived from a C—C bond in the organic SOG interlayer film 22 was detected. In contrast, when the Ta film 24 was formed by 0.4 nm in average thickness, the peak derived from the Ta—C bond was detected from the surface of the Ta film 24. This means that the tantalum carbide (TaC) film 23 was formed on the boundary because Ta in the Ta film 24 reacted with C in the organic SOG interlayer film 22. Then, when the Ta film 24 was further formed to the average thickness 0.8 nm, the peak intensity derived from the Ta—C bond was enhanced rather than the case where the film thickness was set to 0.4 nm.

However, when the Ta film 24 was formed to the average thickness 2 nm, conversely the peak intensity derived from the Ta—C bond was turned to decrease. This is because a thickness of the TaC film 23 formed on the boundary between the Ta film 24 and the organic SOG interlayer film 22 is thinner than 2 nm and thus a signal from the tantalum carbide (TaC) film 23 is weakened by the Ta film 24 formed thereon. That is, if the Ta film 24 is formed on the organic SOG interlayer film 22 in thickness of about 2 nm or more by the sputter, the tantalum carbide (TaC) film 23 having a thickness of 0.8 nm or more but below 2 nm is formed on the boundary between them. The reason why the thickness of the TaC film 23 formed on the boundary between the Ta film 24 and the organic SOG interlayer film 22 is increased in response to the thickness of the Ta film 24 may be considered like that the unreacted Ta on the TaC film 23 can no longer reach the organic SOG interlayer film 22 by the diffusion because the dense TaC film 23 is formed.

In this manner, when the Ta film 24 is formed in excess of the thickness of about 2 nm, the film thickness of the TaC film 23 formed does not depend on the film thickness of the Ta film 24 and is saturated. Therefore, even though the Ta film 24 is formed to have the thicker film thickness on the bottom portion B of the wiring recess 22a than the side portion S of the via 22b, the tantalum carbide (TaC) film 23 can be left as the metal barrier film having the uniform thickness on both the side portion S of the via 22b and the bottom portion B of the wiring recess 22a by removing selectively the unreacted Ta film 24 on the surface layer.

Figure 6C:
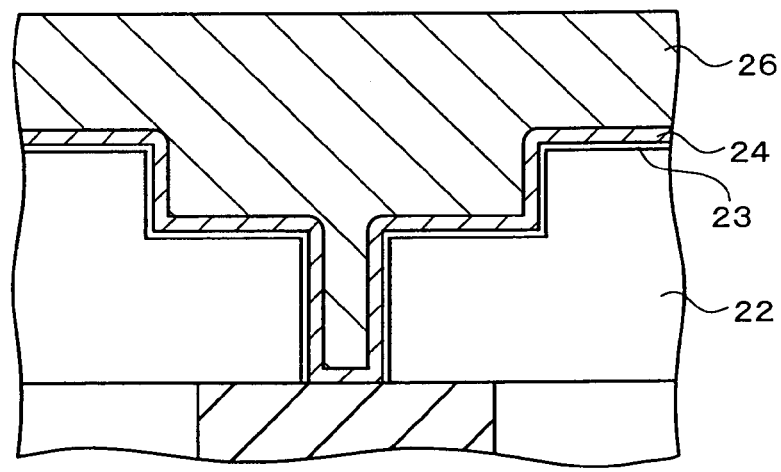

Again, explanation will be returned to the above multi-layered wiring forming method. As shown in FIG. 6C, a seed Cu film 24 is formed on the first organic SOG interlayer film 22 on the surface of which the TaC film 23 is left. Then, a Cu film 26 is formed on the seed Cu film 24 by the electroplating utilizing the seed Cu film 24 as a plating power feeding layer such that the Cu film 26 is filled in the inner sides of the wiring recess 22a and the via 22b.

Figure 6D:
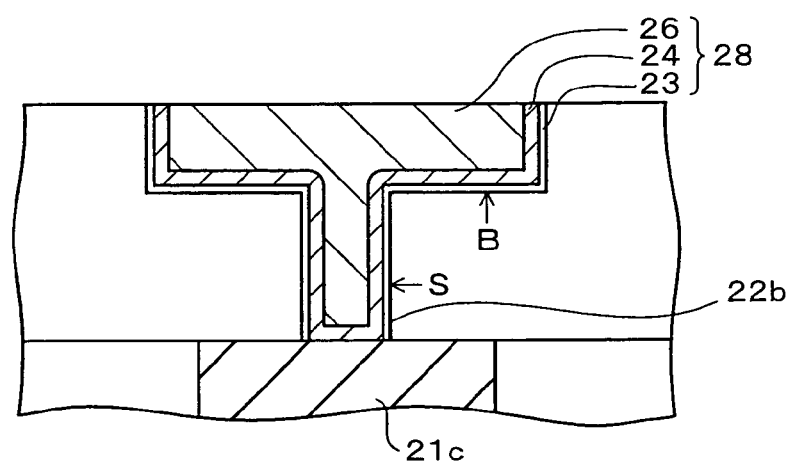

Then, as shown in FIG. 6D, the Cu film 26, the seed Cu film 24, and the TaC film 23 are polished by the CMP method until the upper surface of first organic SOG interlayer film 22 is exposed. Thus, a first wiring layer 28 (metal wiring layer) consisting of the TaC film 23, the seed Cu film 24, and the Cu film 26 is formed.

In this fashion, as shown in FIG. 3, the first wiring layer 28 buried in the wiring recess 22a of the first organic SOG interlayer film 22 is connected to the metal plugs 21a to 21d via the via 22b respectively. Since the TaC film 23 having the Cu diffusion preventing function and a desired film thickness is formed to have the almost identical thickness over the whole area including the side portion S of the via 22b and the bottom portion B of the wiring recess 22a, a occupied rate of the TaC film 23 the resistance of which is higher than the Cu film 26 is never unnecessarily increased in this first wiring layer 28. As a result, an increase in the wiring resistance of the first wiring layer 28 can be prevented and thus the desired wiring resistance can be obtained.

Also, a specific resistance of the TaC film 23 is about 385 μΩm. This value is small to such an extent that such value stands comparison with a specific resistance (about 250 μΩm) of the tantalum nitride (TaN) film that is used normally as the barrier film.

In addition, in the case where the tantalum nitride film formed by the sputter method is used as it is, the tantalum nitride film is formed on the bottom portion B of the wiring recess to have the twice to thrice thickness when the tantalum nitride film is formed on the side portion S of the via to have a thickness of about 10 nm. In the case where such tantalum nitride film is replaced with the tantalum carbide film in the present embodiment that is formed to have the almost identical film thickness (e.g., about 2 nm) on the side portion S of the via and the bottom portion B of the wiring recess, a specific resistance of the barrier film is increased up to about 1.5 times but the resistance of the barrier film in the film thickness direction can be reduced to about ⅙ or less because the film thickness formed on the bottom portion of the wiring recess is reduced 1/10 or less.

Further, the TaC film 23 functions as the barrier film to prevent the diffusion of Cu in the first wiring layer 28 from the side surface of the via 22a and the inner surface of the wiring recess 22a to the first organic SOG interlayer film 22, etc. Therefore, it is not possible that disadvantages are caused such that a relative dielectric constant is increased owing to the diffusion of Cu into the first organic SOG interlayer film 22 to increase a leakage current, etc. In S. J. Wang et al., Thin Solid Films, 394, 180 (2001), the fact that the diode using the tantalum carbide film as the metal barrier film can stand the diode leak test at a high temperature of 100° C. more firmly than the diode using the tantalum film as the metal barrier film is reported with respect to the diffusion of Cu as the material of the metal wiring. For this reason, the tantalum carbide film has the sufficient Cu diffusion preventing function.

After the first wiring layer 28 is formed according to the above method, as shown in FIG. 4, a silicon nitride film (SiN film) 30 of about 50 nm thickness and a second organic SOG interlayer film 22x of about 1 μm thickness, which is formed by the same method as the above first organic SOG interlayer film 22, are formed on the structure in FIG. 3. Then, the second organic SOG interlayer film 22x and the silicon nitride film 30 are etched by the same method as the above-mentioned method. Thus, a wiring recess 22c and a via 22d are formed.

Then, as similarly shown in FIG. 4, the TaC film is formed in the wiring recess 22c and the via 22d by the same method as the above method. Then, the TaC film 23a is obtained on the second organic SOG interlayer film 22x by removing selectively the Ta film. Then, the seed Cu film and the Cu film are formed sequentially on the TaC film 23a, and then a second wiring layer 28a buried in the wiring recess 22c and the via 22d is formed by polishing the Cu film, the seed Cu film, and the TaC film by virtue of the CMP method. As a result, the second wiring layer 28a is connected electrically to the first wiring layer 28 via the via 22d.

Then, an SiN film 32a of about 50 nm thickness and an SiO$_2$ film 32b of about 1 μm thickness are formed sequentially on the second wiring layer 28a and the second organic SOG interlayer film 22x by the CVD method. Thus, an upper interlayer insulating film 32 is formed. Then, a via 32x connected to the second wiring layer 28a is formed by patterning a predetermined portion of the upper interlayer insulating film 32. Then, a metal plug 34 consisting of the glue film and the W film is formed in the via 32x by the same method as the above method. Then, an aluminum (Al) film is formed on the upper interlayer insulating film 32 and the metal plug 34 and then patterned. Thus, an aluminum (Al) pad 36 connected to the metal plug 34 is formed. Then, a protection film 38 for covering the Al pad 36 is formed. Then, an opening portion (not shown) from which the Al pad 36 is exposed is formed by etching the protection film 38 located on the Al pad 36.

With the above, a semiconductor device 1 manufactured by the manufacturing method of the embodiment of the present invention is completed. In the semiconductor device 1 of the embodiment of the present invention, the predetermined transistors T1, T2 are formed on the silicon substrate 10 and then the first wiring layer 28 formed by the dual damascene method is connected to the transistors T1, T2 via the metal plugs 21a to 21d respectively. Then, the first wiring layer 28 is connected to the second wiring layer 28a formed by the dual damascene method. The first wiring layer 28 is formed in the via 22b and the wiring recess 22a formed in the first organic SOG interlayer film 22, and also the TaC film 23 formed to have the almost identical film thickness (e.g., about 2 nm) over the entire surface of the inner surface of the wiring recess 22a and the side portion of the via 22b except the bottom portion is formed. Also, the second wiring layer 28a has the similar structure.

Such TaC film 23 can be formed easily on the boundary by forming the Ta film 24 on the first organic SOG interlayer film 22. In addition, when the Ta film 24 is formed to have the film thickness of 2 nm or more, the film thickness of the TaC film 23 does not depend on the film thickness of the Ta film 24. Further, the unreacted Ta film 24 can be removed selectively from the TaC film 23. In this manner, the TaC film 23 can be formed to have the required minimum and almost identical film thickness that can prevent the diffusion of Cu over the entire surface of the inner surface of the wiring recess 22a and the side portion of the via 22b.

As a result, unlike the case where the barrier film formed by the sputter method is used as it is, such a problem can be overcome that an occupied rate of the barrier film, whose resistance is high, out of the wiring layer formed in the wiring recess is unnecessarily enhanced to increase the resistance of the wiring layer.

The invention claimed is:

1. A semiconductor device manufacturing method comprising the steps of:
   forming a metal film on an organic interlayer insulating film formed over a semiconductor substrate,
   wherein the metal film comprises metal and the organic interlayer insulating film comprises carbon,
   whereby the metal in the metal film and the carbon in the organic interlayer insulating film react with each other at a boundary between the organic interlayer insulating film and the metal film to get a metal diffusion preventing metal carbide film on the boundary; and
   leaving the metal carbide film on the organic interlayer insulating film by removing selectively the metal film from the metal carbide film and thereby forming the metal carbide film only on said boundary.

2. A semiconductor device manufacturing method according to claim 1, wherein a wiring recess and a via formed to communicate with a bottom portion of the wiring recess are provided in the organic interlayer insulating film, and the metal film is formed on the organic interlayer insulating film including inner surfaces of the wiring recess and the via.

3. A semiconductor device manufacturing method according to claim 1, wherein the organic interlayer insulating film is formed of an organic SOG film, and the metal film is formed of a tantalum (Ta) film.

4. A semiconductor device manufacturing method according to claim 3, wherein a film thickness of the tantalum (Ta) film is about 2 nm or more.

5. A semiconductor device manufacturing method according to claim 1, wherein, in the step of leaving the metal carbide film, the metal film is removed selectively from the metal carbide film by a hydrofluoric acid or chemicals including the hydrofluoric acid.

6. A semiconductor device manufacturing method according to claim 3, wherein a relative dielectric constant of the organic SOG film is about 2.4 or less.

7. A semiconductor device manufacturing method according to claim 1, wherein the specific resistance of the metal diffusion preventing film that remains on a surface of the interlayer insulating film is 250 to 385 μΩm.

8. A semiconductor device manufacturing method according to claim 1, wherein a wiring recess are provided in the organic interlayer film, and the metal film is formed on the organic interlayer insulating film including inner surface of the wiring recess.

9. A semiconductor device manufacturing method comprising the steps of:
   forming a metal film on an organic interlayer insulating film formed over a semiconductor substrate,
   wherein the metal film comprises metal and the organic interlayer insulating film comprises carbon,
   whereby the metal in the metal film and the carbon in the organic interlayer insulating film react with each other at a boundary between the organic interlaver insulating film and the metal film to get a metal diffusion preventing metal carbide film on the boundary; and
   leaving the metal carbide film on the organic interlayer insulating film by removing selectively the metal film from the metal carbide film,
   wherein a wiring recess and a via formed to communicate with a bottom portion of the wiring recess are provided in the organic interlayer insulating film, and the metal film is formed on the organic interlayer insulating film including inner surfaces of the wiring recess and the via,
   forming a metal wiring film to fill the via and the wiring recess; and
   forming a metal wiring layer, which is buried in the via and the wiring recess, by polishing the wiring metal film and the metal carbide film.

10. A semiconductor device manufacturing method according to claim 9, wherein the metal carbide film is left to have a substantially identical film thickness on a side portion of the via and a bottom portion of the wiring recess.

* * * * *